United States Patent [19]

Zimmerman et al.

[11] Patent Number: 5,067,382
[45] Date of Patent: Nov. 26, 1991

[54] METHOD AND APPARATUS FOR NOTCHING A LEAD WIRE ATTACHED TO AN IC CHIP TO FACILITATE SEVERING THE WIRE

[75] Inventors: Eckehart Zimmerman; Thomas A. Thorson, both of Colorado Springs, Colo.

[73] Assignee: Cray Computer Corporation, Colorado Springs, Colo.

[21] Appl. No.: 608,258

[22] Filed: Nov. 2, 1990

[51] Int. Cl.$^5$ ............................................. B26D 3/14
[52] U.S. Cl. ...................................... 83/879; 83/693; 83/880; 83/588; 30/245; 29/566.3
[58] Field of Search ................. 83/879, 880, 588, 692, 83/693; 228/4.5; 225/96, 96.5; 29/566.3, 840; 140/105; 72/325; 30/245, 187, 188, 189

[56] References Cited

U.S. PATENT DOCUMENTS

4,425,947 1/1984 Maxner et al. ........................ 140/105

Primary Examiner—Mark Rosenbaum
Assistant Examiner—Allan M. Schrock
Attorney, Agent, or Firm—John R. Ley

[57] ABSTRACT

A method and apparatus for notching a wire so that it can be severed at the notched location by applying an axial force thereto. The apparatus includes a linearly reciprocal mechanism adapted to move forwardly, placing a pair of cutting blades in straddling relationship with the wire and includes an actuating mechanism for laterally reciprocating the cutting blades to form notches in opposite sides of the wire before retracting the cutting blades from the straddling relationship with the wire. The method of the invention includes the steps of moving a pair of cutting blades into straddling relationship with a wire, reciprocally moving the cutting blades into and out of cutting engagement with the wire and subsequently retracting the cutting blades from the straddling relationship with the wire.

29 Claims, 5 Drawing Sheets

Fig_1

Fig_2

METHOD AND APPARATUS FOR NOTCHING A LEAD WIRE ATTACHED TO AN IC CHIP TO FACILITATE SEVERING THE WIRE

BACKGROUND OF THE INVENTION

1. Field of the Invention

The present invention relates generally to methods and apparatus useful in the assembly and packaging of semiconductor integrated circuits (ICs) or chips, and more particularly, for notching lead wires at a precise length to facilitate severing the lead wires at the location of the notch. More particularly still, the present invention relates to notching the lead wires bonded to IC chips without substantially deflecting the lead wires from an orthogonal orientation relative to the chip, thereby facilitating insertion of the lead wires into throughholes in a printed circuit board to which the IC chip is attached.

2. Description of the Prior Art

The present trends in the computer industry are toward higher capacity processing, represented in some instances by faster switching speeds For example, gallium arsenide (GaAs) has been utilized as the base IC semiconductor chip material because of its increased switching speeds. But with increased switching speeds comes the problem of capacitance in the lead wires between components. A given amount of capacitance in a wire will attenuate a higher frequency signal, such as the type generated with faster switching speeds, by an amount greater than the same capacitance will attenuate a lower frequency (slower switching speeds) signal. The total capacitance of a wire increases with the length of the wire. Therefore, in order to capitalize on the faster switching speeds available with GaAs, the capacitance in the lead wires becomes important and the length of the lead wires and the distance between components being connected by the lead wires must be minimized. As a result, the length of the conductors connecting the ICs has been reduced, to reduce the electron transit times and to reduce the capacitance in the lead wires and other conductors, thereby enhancing performance.

One technique of attaching ICs to printed circuit boards involves directly inserting the lead wires from the IC chip into the through holes in the printed circuit board, thus directly connecting the IC chip to the PC board by the lead wires. This technique eliminates the use of the plastic package in which IC chips are commonly packaged, the curved and somewhat lengthy lead wires within the plastic package, and the connection pins extending from the package into a connector. One example of this technique is disclosed in U.S. Patent Application Ser. No. 376,156, filed June 30, 1989, for LEAD BONDING OF CHIPS ONTO CIRCUIT BOARDS ND CIRCUIT BOARDS ONTO CIRCUIT BOARDS.

The attachment of these lead wires to the electronic component is an exacting process requiring close tolerances. Accordingly, when using these techniques with GaAs chips, relatively short lead wires are attached to the chip and inserted directly into aligned holes in a printed circuit board. The chips are thus positioned side by side and stacked in a closer relationship. The holes into which the lead wires are directly inserted typically have a diameter of only about 5 mils, and the lead wire has a diameter of about 3 mils. As many as fifty or so lead wires may be connected to each chip. It can be appreciated that in order for the lead wires to be reliably inserted into the holes in the circuit board, the lead wires must be uniformly straight and of a uniform length. If the lead wires are not straight for alignment with the holes in the circuit board, a technician using a microscope will have to straighten each lead wire individually in order to make them fit into the holes in the circuit board.

Current devices for cutting lead wires on GaAs components involve notching the wire A notch is first made and then an axial force is applied on the wire away from the chip to separate the wire at the notch by tensile separation force. This prior art device utilizes a pair of separate blades which extend towards the wire and simultaneously close together to cut or notch the wire. The blades also open up while simultaneously retracting from the wire. It can be appreciated that, with the wires having a diameter of only 3 mils, this device often bends or deforms the orientation of the wire by pushing and pulling on the wire in the direction of the extension and retraction of the blades, respectively. Furthermore, the degree or amount by which the two separate blades are closed together is difficult to accurately control to create a notch of a specified depth, when the inward movement of the blades is related to their forward extension.

It is to overcome these and other shortcomings in the prior art and to provide a system for cutting lead wires so that they are dependably straight and alignable with predesignated holes in a circuit board that the present invention was developed.

SUMMARY OF THE INVENTION

The present invention concerns uniformly notching lead wires connected to a computer chip so that the wires can be severed by applying an axial force thereto, while maintaining the lead wires in a straight orthogonal extension away from the chip. The present invention is advantageously used in conjunction with a device which ultrasonically bonds lead wires to semiconductor chips.

A notcher device of the present invention is mounted on a universally movable mounting structure to be positively positioned relative to a chip to which lead wires are being attached The chip itself is mounted on a platform for movement in a predetermined horizontal plane so that each lead wire on the chip can be positioned relative to the notcher to permit the notcher to uniformly notch each wire at a predetermined height above the surface of the chip and without bending the wire. After the notch has been formed, an axial force applied to the wire separates the wire at the notched location and the axial force on the wire assures that the wire extends perpendicularly and straight away from the chip to facilitate insertion of the lead wires into the corresponding holes in a circuit board.

The notcher device includes a pair of cutting blades which are positionable on opposite sides of and in straddling relationship with the lead wire to be notched and an actuating means adapted to move the cutting blades in a reciprocal manner toward and away from each other to cut notches in opposite sides of the wire, leaving a relatively thin uncut neck portion Means of the notcher device also extends and retracts the cutting blades into and out of their straddling relationship with the lead wire separately from moving the blades in a reciprocal manner toward and away from one another After an axial force has been applied to the notched wire and the wire severed at the notched location, the chip is moved to the next position where another lead wire is first attached to the chip and then the notcher device is again extended toward the wire until the cutting blades straddle the wire and the notching sequence is again repeated.

The actuating means of the notcher device employs eccentric and cam actuation to create linear movements of relatively few component parts whereby in one continuous sequence of steps, the cutting blades of the notcher device are first advanced into straddling relationship with the wire, next reciprocated toward and away from each other to cut notches on opposite sides of the wire, and subsequently withdrawn from a straddling relationship with the wire, thereby avoiding the application of a lateral force on the wire and leaving the wire in a position whereby an axial force can be placed thereon to sever the wire at the notched location.

Other aspects, features and details of the present invention can be more completely understood by reference to the following detailed description of a preferred embodiment, taken in conjunction with the drawings, and from the appended claims.

DESCRIPTION OF THE PREFERRED EMBODIMENT

Figure 1:
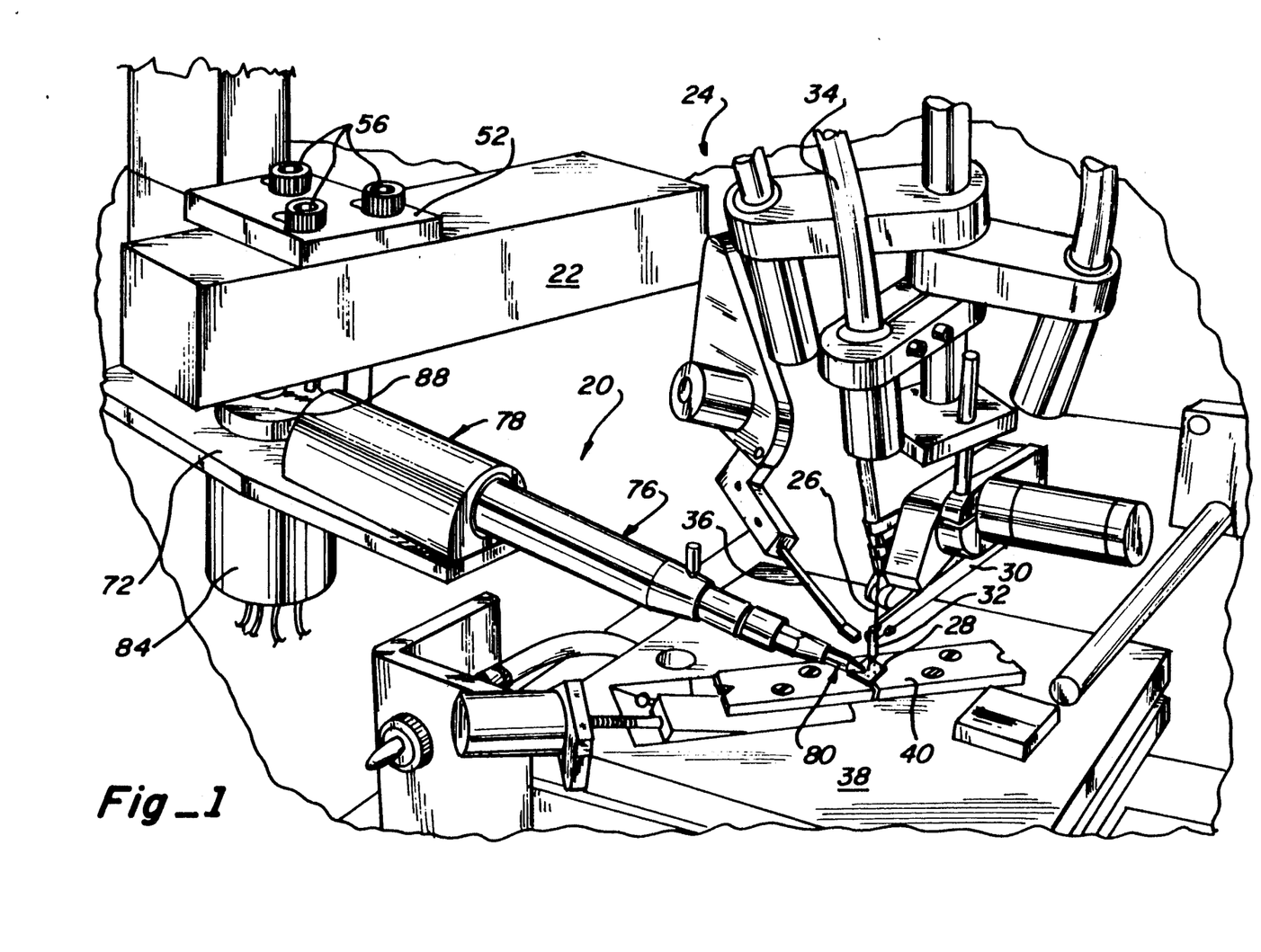
FIG. 1 is a perspective view of a notcher device in accordance with the present invention connected to a conventional ultrasonic lead wire bonding device.

The notcher device 20 of the present invention is shown in FIG. 1 connected to an arm 22 of a bonder device 24, of the type manufactured by Hughes Aircraft and identified by Model No. 2460. The bonder device 24 is used to attach a solid gold lead wire 26 to a semiconductor integrated circuit die or chip 28. The bonding occurs in a conventional manner by mechanical ultrasonic vibrations induced by an arm 30 and a hollow tip 32, through which the wire 26 is threaded. The wire 26 is supplied through a guide 34 from a spool (not shown). An electrically charged electrode 36 is positioned adjacent to the arm 30 and tip 32. The electrode 36 conducts a high momentary electrical current through the lead wire 26 when the arm 30 moves the end of the lead wire into adjacency with the electrode 36.

To attach a lead wire to the chip 26, the arm 30 moves the end of the wire 26 into adjacency with the electrode 36. An arc occurs and the end of the wire is formed into a molten ball of metal. Immediately thereafter, the arm 30 and tip 32 move the end of the wire 26 onto a previously prepared contact pad on the chip 28. Ultrasonic vibrations are induced in the wire, thereby attaching it to the contact pad. This procedure repeats itself for each of the lead wires connected to the chip 28. An x-y movement table 38 moves the chip to position it to receive the next attached lead wire. Appropriate holding means 40 are connected to the x-y table 38 in order to retain the chip firmly in position. An x-axis is along one horizontal edge of table 38 while a y-axis is along another horizontal edge of table 38 A z-axis is orthogonal to these two edges and points downward from the table 38.

Other elements of the bonder 24 include light sources for illuminating the work area, so that it might be better observed by video cameras or microscopes (none of which are shown).

The general function of the notcher device 20 is to create a notch in opposite sides of the wire 26 at a predetermined location above the chip after the wire has been bonded to the chip, without deforming the wire. The neck or portion remaining between the notches formed may have a thickness of only 0.0002 to 0.0005 inches, controllable to an extremely fine resolution, for example, 0.0001 of an inch. After the notch is created, the arm 30 and tip 32 pull the wire upwardly, inducing linear tensile separation force on the neck portion and causing the wire to break at the notch. For the particular application of the present invention, it is desired that all the lead wires from the chip 28 extend vertically therefrom and in a straight line so as to facilitate accurate and dependable attachment of the chip 28 to a circuit board. For example, as many as fifty-two leads may be attached to a square chip having dimensions of about 150 mils on each side. These fifty-two lead wires must thereafter be inserted and aligned into correspondingly located holes in a circuit board, to thereby attach the chip to the circuit board in a conventional manner.

The function of the notcher device 20 is to allow each of the lead wires to be severed at the notched location, but without deforming the lead wires from an orthogonal extension up from the chip 28. By not deforming the lead wires, the insertion of the wires into the holes of the circuit board is greatly facilitated.

Figure 2:
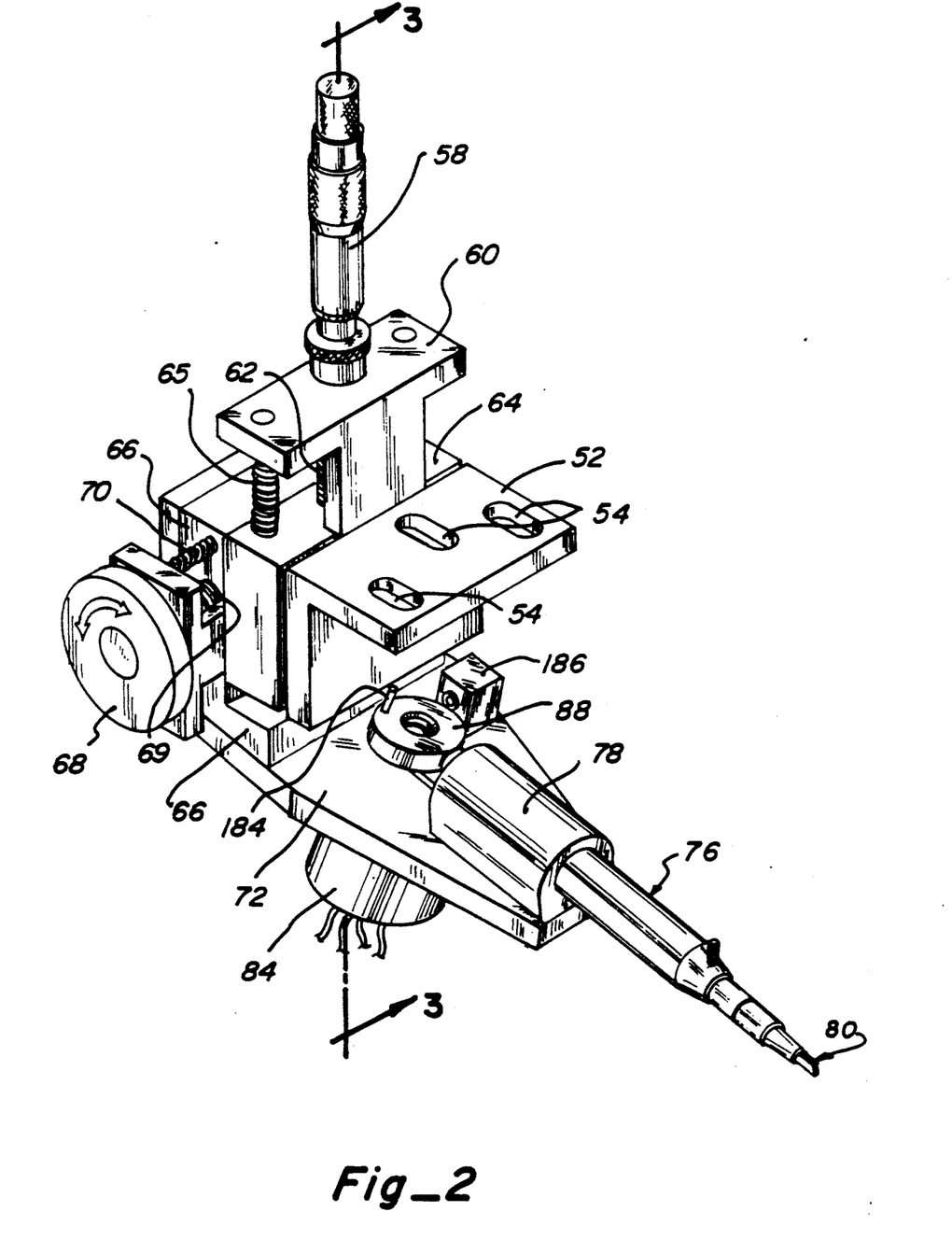
FIG. 2 is a perspective view of the notcher device shown in FIG. 1.
Figures 3, 4:
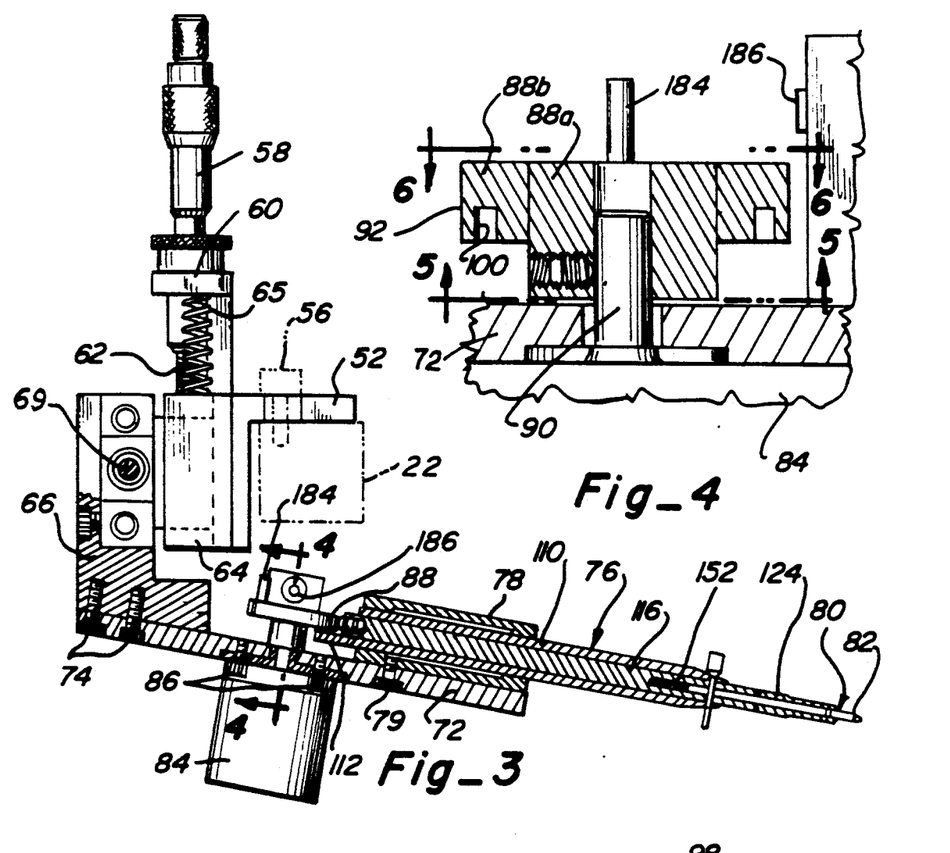
FIG. 3 is a partial cross-sectional view of the notcher device shown in FIG. 2 taken substantially in the plane of line 3—3 of FIG. 2.
FIG. 4 is a section view taken substantially in the plane of line 4—4 of FIG. 3.

Adjustment of the position of the notcher device 20 in order to achieve its functions is better understood by reference to FIGS. 1, 2 and 3. A mounting bracket 52 connects the notcher device 20 to the bonder arm 22. Elongated slots 54 (FIG. 2) are formed in the bracket 52 to slidably adjust the position of the notcher device 20 in a desired x-axis direction. Bolts 56 (FIG. 1) retain the mounting bracket 52 to the arm 22. A finely-threaded micrometer 58 is stationarily attached to a bracket 60, and the bracket 60 is attached to the mounting bracket 52. A shaft 62 of the micrometer 58 abuts a moveable block 64. The block 64 is retained for vertical sliding movement in a z-axis plane relative to the mounting bracket 52 by conventional means not shown. Spring biasing means 65 urge the block 64 upwardly into engagement with the shaft 62. Adjustment of the micrometer 58 has the effect of varying the vertical position of the block 64, thereby positioning the notcher device at a desired z-axis location. A y-axis movement block 66 is slidably attached to the block 64 in a conventional manner. A finely-threaded screw 68 has a shaft 69 which abuts block 66 and spring biasing means 70 urges the block 66 toward the shaft. Adjustment of the screw 68 thereby functions to adjust the movement block 66 in a y-axis direction, thereby positioning the notcher device at a desired y-axis location. As is apparent from the foregoing description, the notcher device 20 can be positioned in a predetermined location in any of the three axes of three-dimensional space.

A base plate 72 of the notcher device 20 is connected to the y-axis movement block 66 to thereby achieve the 3 axis adjustment system described previously. Bolts 74 (FIG. 3) attach the base plate 72 to the y-axis movement block 66.

A primary component of the notcher device 20 is a carriage assembly 76 which is mounted on a mounting structure or mounting plate 72 by a bolt 79. The carriage assembly 76 is carried by and supported in a carriage housing 78. Longitudinal movement of the carriage assembly 76 causes a bifurcated leading portion of a blade member 80 to extend forwardly, causing tips 82 of the bifurcated blade member 80 to extend on each side of or straddle the lead wire 26 to be notched. The longitudinal movement of the carriage assembly 76 also causes the blade tips 82 to close inwardly and notch the wire 26, to open outwardly to a separated position and thereafter withdraw. This forward extension, inward notching movement, outward separating movement, and rearward withdrawing movement is all achieved by linear sliding movement of the carriage assembly 76 in the carriage housing 78, as will be explained in greater detail below. As is further described below, the inward notching movement and outward separating movement are independent of the forward extension and rearward withdrawing movement.

The described functions of the notcher device are achieved by the rotation of a stepper motor 84, which is attached to the mounting plate 72 by screws 86. A wheel 88 having a hub 88a and an outer fixed ring 88b (FIGS. 4 to 7) is attached to a shaft 90 of the motor 84, as is shown in FIG. 4. The wheel 88 includes an outer circular peripheral surface 92 which is concentric about an axis 94 of the shaft 90, as is shown in FIG. 6. A cam lobe 96 extends radially outwardly from the circular surface 92. A cam follower 98 of the carriage assembly 76 contacts and rides upon the exterior circular surface 92 and cam lobe 96 during rotation of the wheel 88.

Figure 5:
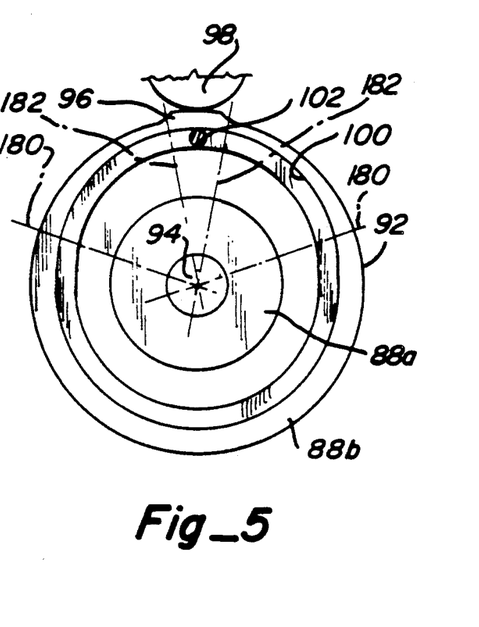
FIG. 5 is a section view taken substantially in the plane of line 5—5 of FIG. 4.
Figure 6:
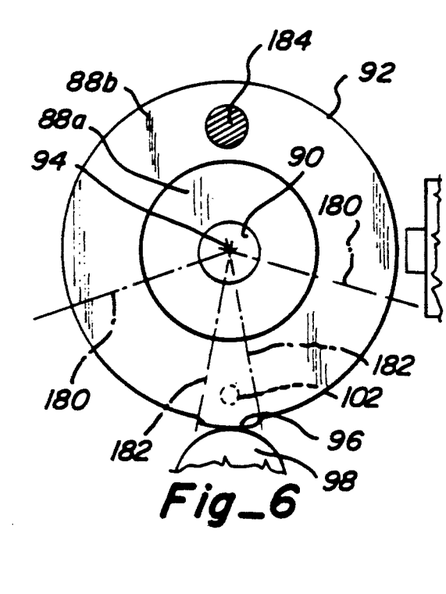
FIG. 6 is a section view taken substantially in the plane of line 6—6 of FIG. 4.

A circular groove 100 is formed in the wheel 88 along a bottom surface thereof, as is shown in FIGS. 4 and 5. The groove 100 is circular, but it is positioned eccentrically with respect to the rotational axis 94 of the wheel 88. A cylindrical cam follower pin 102 fits within the groove 100, and is connected to the carriage assembly 76. Relative rotation of the wheel 88 longitudinal extension and retraction of the carriage assembly 76 due to the eccentrically located groove 100 and the cam follower pin 102 riding therein. The inward notching movement and outward separation movement of the blade tips 82 is controlled by the effect of the cam lobe 96 on the cam follower 98, as is described below. The interrelationship of the longitudinal extension and retraction of the carriage assembly, and the inward and outward notching movements, are controlled by the eccentric relationship of the groove 110 relative to the position of the cam lobe 96. The stepper motor 84 is one example of a power means for driving an eccentric system represented here by cam lobe 96 and eccentric groove 100. Cam follower 98 and cam follower pin 102 are two examples of connector means for connecting the eccentric system to the actuating means. The details of these functional effects is better understood with respect to the carriage assembly 76 as shown in FIG. 7.

Figures 7, 8:
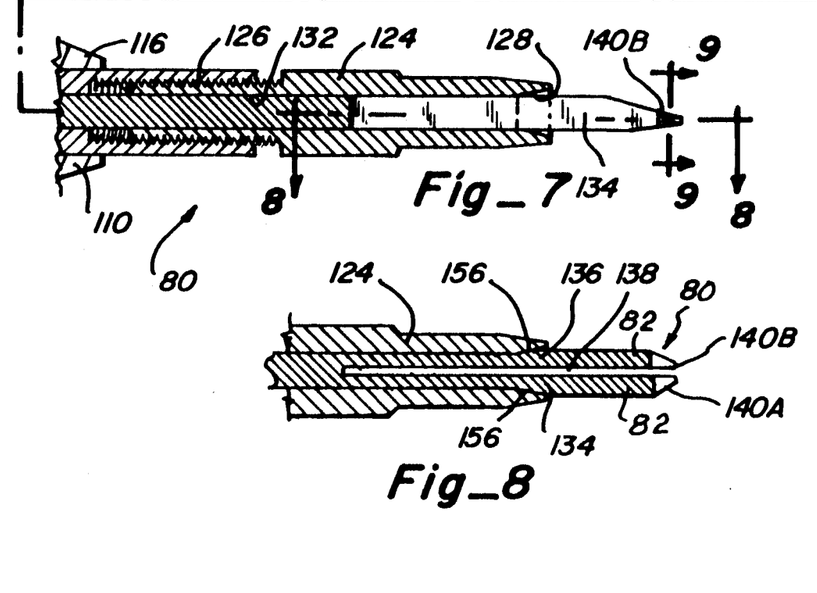
FIG. 7 is an enlarged view of a portion of FIG. 3, with portions broken away.
FIG. 8 is a section view taken substantially in the plane of line 8—8 of FIG. 7.

More details regarding the carriage assembly 76 and the wheel 88 are shown in FIG. 7. The carriage assembly 76 includes a sleeve carriage 110 which is generally cylindrical in cross section. An arm 112 extends from a rearward end of the sleeve carriage 110. The cam follower pin 102 is positively positioned in a correspondingly shaped opening within the rearward end of the arm 112. Rotation of the wheel 88 with the pin 102 in the groove 100 causes the sleeve carriage 110 and all of the other elements of the carriage assembly 76 assembled with respect thereto to reciprocally move linearly in the direction of the longitudinal axis of the sleeve carriage. The flat bottom surface of the outer fixed ring 88b of the wheel 88 is in sliding frictional contact with the flat upper surface of the arm 112 so that the sleeve carriage 110 is prevented from rotating about its longitudinal axis in the carriage housing 78.

The sleeve carriage 110 is retained for longitudinal movement in the carriage housing 78 by bushings 114. A slider shaft 116 is retained for longitudinal movement within the hollow interior of the sleeve carriage 110. A bushing 118 slidably supports the rearward end of the slider shaft 116, and an interior cylindrical surface 120 at the forward end of the sleeve carriage 110 slidably supports the forward end of the slider shaft 116. The bushings 114 and 118 preferably are made of Torlon ® material. A threaded shaft 122 extends from the cam follower 98 and is threaded into threads formed in the rear end of the slider shaft 116. In this manner, the cam follower 98 is attached to the slider shaft for unitary movement therewith, and the relative longitudinal position of the slider shaft 116 is adjusted relative to the outer surface of the ring 88b. Upon the cam lobe 96 contacting the cam follower 98, the slider shaft is moved longitudinally forward relative to the sleeve carriage 110. Thus, independent linear longitudinal movement of both the sleeve carriage 110 and the slider shaft 116 is provided and controlled by the groove 100 and the cam lobe 96 on the ring 88b.

By locating the slider shaft 116 within the sleeve carriage in a generally coaxial and concentric manner, the overall orientation of the carriage assembly at the end where the blade member 80 attaches is long, thin and pencil-like. Thus the notcher 20 is able to project into spots or locations of limited space. This is an important consideration in view of the relative overall small size of the IC chip to which the leads are attached. Furthermore the concentric nested orientation of the elements and the use of the relatively small bushings allow the elements to act somewhat as bushings with respect to one another, thereby reducing play and increasing the precision locating the notch while helping avoid bending the lead in which the notch is made.

Figure 9:
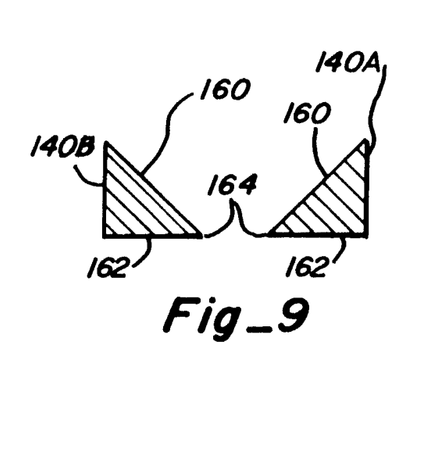
FIG. 9 is a section view taken substantially in the plane of line 9—9 of FIG. 7.

A blade sleeve tip 124 is positively attached by threads 126 to the forward end of the slider shaft 116. The blade sleeve tip 124 and the slider shaft in combination are one example of actuating means for causing the blade member 80 to notch the wire 26. A forward end of the blade sleeve tip 124 has formed therein a frusto-conically shaped surface 128 which diverges forwardly, as is shown in FIG. 8. The blade member 80 is positioned within a hollow interior 132 of the blade sleeve tip 124. The forward end of the blade member 80 is bifurcated as shown in FIG. 8, thereby defining a pair of relatively movable, resilient and moderately flexible arm or blade portions 134 and 136, separated by a slot 138. The extreme forward end of the blade member 80 has the notching tips 82 defining tip portions 140A and 140B, the cross section of which is illustrated in FIG. 9.

The rear end of the blade member 80 is connected to the sleeve carriage 110 by a pin 142 (FIG. 7). A shank 144 of the pin 142 extends through openings 146 in the forward end of the sleeve carriage 110 and through an opening 148 in the rear end of the blade member 80. Shank 144 fits tightly within the openings 146 and 148 and thereby rigidly retains the blade member for movement in unison with the sleeve carriage 110. A larger opening 150 is formed in the slider shaft 116, so as to allow the slider shaft 116 to move relative to the shank 144 of the pin 142 and the blade member 80 (FIG. 7). The slider shaft 116 is biased toward its rearwardmost position with the cam follower 98 contacting the outer surface 92 and cam lobe 96 of the ring 88b, by action of a spring 152. The spring 152 fits within a hollow cylindrical pocket 154 formed at the forward end of the slider shaft. The spring 152 is held in slight compression. Because the blade member 80 is directly connected by the pin 142 to the sleeve carriage 110, the compression force from the spring 152 continually urges or biases the slider shaft 116 toward a rearwardmost position relative to the sleeve carriage 110. When the slider shaft 116 moves forwardly due to the cam lobe 96 contacting and moving the cam follower 98, the bias of the spring 152 is overcome, thereby compressing the spring to a slightly greater extent.

Figures 10, 16:
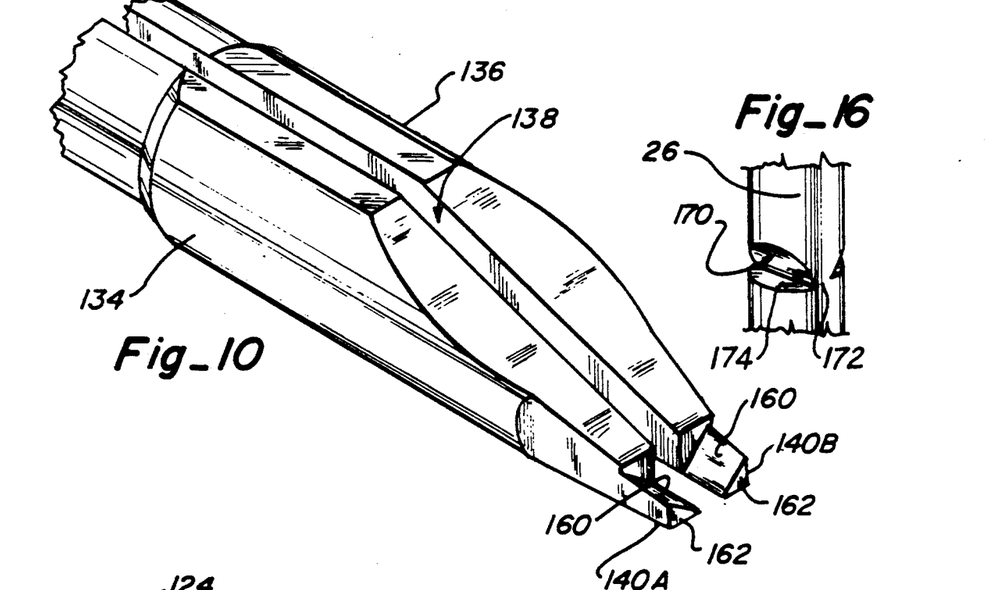
FIG. 10 is an enlarged perspective view of a leading portion of a cutter arm of the notcher device, as shown in FIGS. 1, 2 and 7.
FIG. 16 is a perspective view of the wire shown in FIGS. 14 and 15 further illustrating the configuration of the notch made by the cutting arms of the notcher device during operation.
Figure 11:
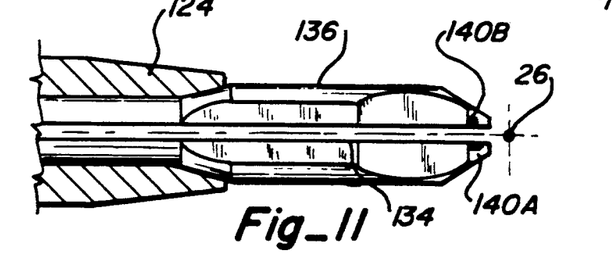
FIGS. 11, 12 and 13 are sequential plan views showing the operation of the leading portion of the cutter arm shown in FIG. 10, forming a notch in a wire.
Figure 13:
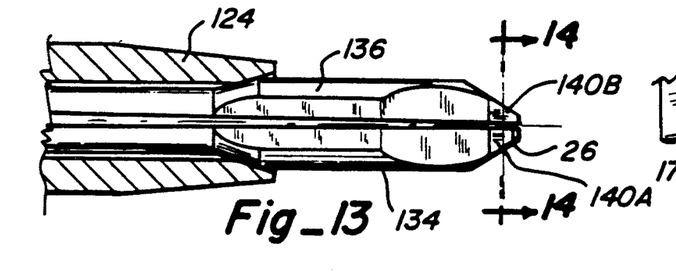

At approximately a mid-location of the length of each blade portion 134 and 136, there is formed an outwardly diverging partially frusto-conical cam surface 156, as is shown in FIGS. 8 and 10. The surface 156 normally engages the surface 128 of the blade sleeve tip 124, as is shown in FIGS. 8 and 11. However, upon forward linear longitudinal movement of the slider shaft 116 and the attached blade sleeve tip 124, the surface 128 slides along the surface 156, thereby forcing the two blade portions 134 and 136 toward one another, as is shown in FIG. 13. Forcing the blade portions 134 and 136 toward one another moves the tip portions 140A and 140B inwardly for notching the wire 26, as described in greater detail hereinafter. Notching movement is achieved as a result of the slider shaft 116 and blade sleeve tip 124 moving linearly relative to the sleeve carriage 110 and the rigidly attached blade member 80. After notching, the outward force of the resiliently inwardly deflected blade portions 134 and 136 causes an outward force of the surface 156 against the surface 128, thereby helping to move and bias the slider shaft 116 rearwardly.

The degree of inward or lateral movement of the tip portions 140A and 140B toward one another is controlled by the relative longitudinal positions of the surfaces 128 and 156, prior to forward longitudinal movement of the slider shaft 116 and blade sleeve tip 124. The relative longitudinal positions are adjusted in accordance with the degree to which the blade sleeve tip 124 is threaded into the forward end of the slider shaft 116 at the threads 126 (FIG. 7). By adjusting the blade sleeve tip 124 inward toward the rear of the slider shaft 116, less inward or lateral movement of the tips 140A and 140B is achieved. Conversely, screwing the blade sleeve tip 124 outwardly with respect to the forward end of the slider shaft 116 achieves a greater degree of inward or lateral movement of the blade tip portions 140A and 140B.

Figure 14:
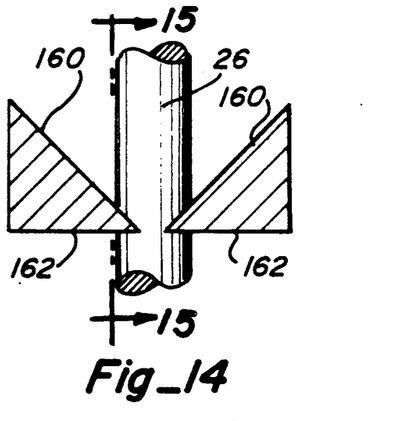
FIG. 14 is an enlarged section view taken substantially in the plane of line 14—14 of FIG. 13.
Figure 15:
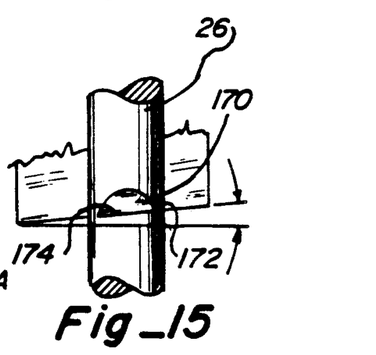
FIG. 15 is a side elevational view of the wire shown in FIG. 14 taken substantially in the plane of line 15—15 of FIG. 14 and illustrating the configuration of the notch made by the cutter arm of the notcher device during operation.

The configuration of the blade tip portions 140A and 140B is best illustrated in FIGS. 9 and 10. In cross section, each of the blade tip portions is formed with an upward sloping surface 160 and a generally horizontal surface 162. An edge 164 at the intersection of the surfaces 160 and 162 forms a cutting edge which causes an indention or notch 170 to be formed in the wire (FIGS. 14 and 16) when the tip portions are moved toward each other. When notched, the wire 26 remains integral only in a narrow neck or bridge portion 172 (FIG. 15).

As is illustrated in FIG. 3, the carriage assembly 76 is oriented generally in a downwardly angled manner. Consequently, the lower horizontal surfaces 162 of the blade tip portions 140A and 140B create a generally but slightly inclined flat surface 174 (FIGS. 15 and 16) of the notch 170 in the wire 26. The angle of inclination of this flat surface 174 is parallel with the longitudinal axis of carriage assembly 76 and therefore parallel with the direction of movement of the carriage assembly 76 and blade member 80. When the upper portion of the wire is separated from the lower portion by an upward axial force produced by the bonder, the bridge portion 172 generally breaks in the inclined plane of the surfaces 174. Thus, the upper end of the wire 126, which has previously been fixed to the chip 28, generally has an inclined orientation as is shown in FIG. 15. This inclined orientation is advantageously used in connecting the wire 26 to a circuit board (not shown) to establish an electrical connection to the chip 28. Details regarding the connection of the wire to the circuit board, and the advantageous nature of the inclined surface 174 are described in co-pending U.S. Pat. Application Nos. 07/376,156 (mentioned previously) and 07/053,142 filed May 21, 1987 and entitled Gold Flying Leads for Integrated Circuits and Lead Bonding of Chips unto Circuit Boards, respectively.

Figure 12:
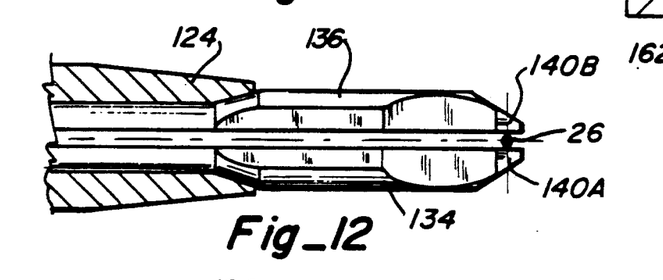

The method and operation of creating the notch 170 in the wire 26 is best appreciated by reference to FIGS. 11-13. FIG. 11 illustrates the initial beginning position, wherein the carriage assembly 76 is in the longitudinally retracted position. The wire 26 is positioned on a center line through the slot 138, due to the prior orientation of the x-y movement table 38 and the adjustment of the notcher device 20 as previously described and shown in conjunction with FIG. 1. The sleeve carriage and the attached blade member 80 are in a longitudinally withdrawn position, as is the slider shaft and the blade sleeve tip 124. Upon commencing the notching operation, as is shown in FIG. 12, the stepper motor 94 rotates the wheel 88, and the eccentrically positioned groove 100 forces the cam follower pin 102 and the attached sleeve carriage 110 to move linearly into a longitudinally forward position, wherein the wire 26 is straddled by the blade tip portions 140A and 140B. This linear movement is achieved generally by rotational movement of the wheel 88 through an arc defined by the dashed lines 180 shown in FIG. 6. The blade sleeve tip 124 moves linearly forwardly with the blade member 80 as a result of the whole carriage assembly 76 moving forwardly.

After the forwardmost position Illustrated in FIG. 12 is attained, it is maintained due to the cam follower pin 102 remaining in the groove 100 at the forwardmost location over the arc defined by dashed lines 180 as the wheel 88 rotates (FIG. 5). As the wheel 88 continues to rotate, the cam lobe 96 contacts the cam follower 98, thereby forcing the slider shaft 116 and blade sleeve tip 124 to move linearly to a forwardmost position. The forward movement of the blade sleeve tip forces the surface 128 forwardly relative to the surface 156, as shown in FIG. 13, thereby moving the blade portions 134 and 136 toward each other. As the blade portions move toward each other, the tip portions 140A and 140B form the notch 170 in the sides of the wire 26. The notching movement is achieved through the rotation of the wheel 88 defined in an arc bounded by the lines 182, as is shown in FIG. 5. After the wheel 88 has rotated through the arc defined by lines 182, the cam follower 98 returns in contact to the peripheral surface 92 and the slider shaft 116 and blade sleeve tip 124 move linearly rearwardly, thereby allowing the blade tip portions 140A and 140B respectively to withdraw from the inward position. This withdrawn position is also illustrated in FIG. 12. Thus, movement of the cam follower over the lobe causes the blade tip portions to reciprocate laterally, allowing a notch to be formed in the wire.

Upon continued rotation of the wheel 88, the carriage assembly is withdrawn to the initial position illustrated in FIG. 11 so that the blade tip portions no longer straddle the wire 26. Thus, movement of the cam follower pin 102 in the eccentrically positioned groove 100 is one means for causing the blade member 80 to reciprocate into and out of straddling relationship with the wire 26. Thereafter, with the notch 170 formed in the wire 26 as is illustrated in FIG. 16, the bonder device exerts an upward axial force on the wire 26 thereby separating the wire at the bridge 172.

The position of the stepper motor 84 is sensed and controlled through each rotation by a pin 184 located in the upper surface of the wheel 88, as is shown in FIGS. 2, 3, 4 and 5. An electromagnetic sensor 186, mounted on the plate 72 adjacent to the wheel 88, senses each rotation of the wheel, and delivers appropriate signals to a control system (not shown) for controlling the energization and operation of the stepper motor 84 in relation to the previously described functions of the bonder 24. This control system could be readily determined by one skilled in the art and accordingly a more detailed description thereof is not felt necessary. Use of the stepper motor 84 is advantageous in this application because its rate of rotation during predetermined segments of each rotation can be precisely controlled. For example, it is advantageous to slow the stepper motor during the advancing operation (rotation through the arc 180, FIG. 5), and slow the stepper motor even further during the notching operation (rotation through arc 182, FIG. 5). During other portions of the rotation, the motor can be operated at faster rates.

It is apparent from the foregoing description that the notcher device 20 of the present invention creates a notch in a lead wire by separate, but interrelated and coordinated, extending and retracting longitudinal movements as well as inward and outward lateral movements. The extending and retracting longitudinal movements are independent of the inward and outward lateral movements. Thus, the movements are not occurring simultaneously and, as a consequence, the wire is not bent or deformed as with prior art systems in which the movements are simultaneous. A much improved notch is attained, and the perpendicular extension of the wire from the chip is maintained, to assist in inserting a plurality of such wires into corresponding holes in a printed circuit board.

Although the present invention has been described with a certain degree of particularity, it is understood that the present disclosure has been made by way of preferred example, and changes in detail or structure may be made without departing from the spirit of the invention, as defined in the appended claims.

The invention claimed is:

1. A notcher for notching a wire to facilitate a separation of the wire by applying linear tensile separation force to a remaining portion of the wire at the notched location, comprising in combination:
   a mounting structure;
   a blade member mounted on said mounting structure, the blade member including a pair of spaced blade portions moveable into a straddling relationship with the wire and also moveable in a reciprocating manner into and out of notching engagement with the wire positioned therebetween; and
   actuating means mounted on said mounting structure and including a carriage structure for movably supporting the blade member, said actuating means operatively linearly moving the blade member to position the blade portions into and out of the straddling relationship with the wire and for separately and independently moving the blade portions reciprocatively into and out of notching engagement with the wire, the linear movement of the blade member being separate and distinct from the reciprocating movement of the blade portions during notching engagement with the wire, the notching engagement of the wire occurring while the blade member has ceased linear movement, the notching engagement leaving a remaining portion of the wire at the notched location at which the linear tensile separation force will separate the wire.

2. A notcher as defined in claim 1 wherein:
   the blade member includes a pair of flexible resilient elongated parallelly-disposed arms, each arm including a blade portion; and
   the arms are resiliently deflected toward one another during notching engagement with the wire.

3. A notcher as defined in claim 1 wherein:
   the carriage structure further includes carriage means connected to the blade member and operative for linearly moving the blade member between an extended position in which the blade portions straddle the wire and a retracted position in which the blade portions are not straddling the wire.

4. A notcher as defined in claim 3 wherein:
   the carriage means further operatively induces movement of the blade portions toward one another during notching engagement with the wire.

5. A notcher for notching a wire to facilitate separation of the wire at the notched location, comprising in combination:
   a mounting structure;

a blade member mounted on said mounting structure, the blade member including a pair of spaced blade portions moveable into a straddling relationship with the wire and also moveable in a reciprocating manner into and out of notching engagement with the wire positioned therebetween;

actuating means mounted on said mounting structure and operative for linearly moving the blade member to position the blade portions into and out of the straddling relationship with the wire and for separately and independently moving the blade portions reciprocatively into and out of notching engagement with the wire, the linear movement of the blade member being separate and distinct from the reciprocating movement of the blade portions during notching engagement with the wire, the notching engagement of the wire occurring while the blade member has ceased linear movement;

the actuating means further including carriage means connected to the blade member and operative for linearly moving the blade member between an extended position in which the blade portions straddle the wire and a retracted position in which the blade portions are not straddling the wire;

the carriage means further operatively inducing movement of the blade portions toward one another during notching engagement with the wire, and further comprising:

sleeve means operatively connected to the blade member and operative when moved linearly for moving the blade member between the extended and retracted positions; and slidable means operatively positioned to contact the blade member and induce inward flexing movement of the blade portions toward one another to reciprocate the blade portions into notching engagement with the wire.

6. A notcher as defined in claim 5 wherein:
the actuating means further includes motive means mounted on said mounting structure for obtaining linear movement of the sleeve means and the slideable means.

7. A notcher as defined in claim 6 wherein:
the motive means includes an eccentric member, eccentric surface means attached to the eccentric member, and a motor means for rotating the eccentric member; and
the actuator means further comprises connector means operatively contacting the eccentric means of the eccentric member to obtain linear movement of the sleeve means and the slideable means upon rotation of the eccentric member.

8. A notcher as defined in claim 7 wherein the motor means further comprises a stepper motor.

9. A notcher as defined in claim 7 wherein the eccentric means and the connector means operatively interact to linearly move the sleeve means and the slideable means in unison to position the blade member in the extended and retracted positions and to further linearly move the slideable means relative to the sleeve means to obtain the reciprocative movement of the blade portions into and out of notching engagement with the wire.

10. A notcher as defined in claim 9 wherein:
the eccentric means of the eccentric member includes a plurality of cam surfaces formed thereon, one of the cam surfaces operatively moving the sleeve means and another of the cam surfaces operatively moving the slideable means.

11. A notcher as defined in claim 9 wherein:
the blade portions of the blade member each include a cam surface formed thereon;
the sleeve means includes a cam surface formed thereon in a position for contacting the cam surface of the blade portions;
the cam surfaces of the sleeve means and the blade portions contact each other during relative linear movement of the sleeve means and the slidable means to deflect the blade portions into notching engagement with the wire upon relative linear movement of the slidable means and sleeve means.

12. A notcher as defined in claim 11 wherein the actuating means linearly moves the blade member to position the blade portions into straddling relationship with the wire, moves the blade portions reciprocatively into and out of notching engagement with the wire, and linearly moves the blade member to position the blade portions out of straddling relationship with the wire, by a single complete rotation of the motor means.

13. A notcher as defined in claim 12 wherein the motor means:
rotates at a first predetermined rate to cause the actuating means to move the blade member to position the blade portions into straddling relationship with the wire;
rotates at a second predetermined rate to cause the actuating means to move the blade portions reciprocatively into and out of notching engagement with the wire;
rotates at a third predetermined rate to cause the actuating means to move the blade member to position the blade portions out of straddling relationship with the wire; and wherein:
the first predetermined rate is greater than the second predetermined rate; and
the third predetermined rate is greater than the first predetermined rate.

14. A notcher as defined in claim 11 wherein the motor means rotates at a predetermined lower rate to cause the actuating means to move the blade portions reciprocatively into and out of notching engagement with the wire, than the motor means rotates to cause the actuating means linearly move the blade member to position the blade portions into and out of the straddling relationship with the wire.

15. A notcher as defined in claim 11 wherein:
the slideable means and the blade member are operatively interconnected by adjustable means, the adjustable means establishing the relative position of the cam surfaces of the sleeve means and the blade portions to control the amount of deflection of the blade portions upon relative movement of the sleeve means and the slideable means during notching engagement with the wire.

16. A notcher as defined in claim 5 wherein:
the sleeve means and the slideable means are each elongated and are located coaxially and concentrically with respect to one another.

17. A notcher for notching a wire to facilitate a separation of the wire at the notched location, comprising in combination:
a mounting structure;
an elongated sleeve carriage member mounted on said mounting structure for linear reciprocating movement;

an elongated slide member mounted for relative linear slideable movement with respect to the sleeve carriage member;

a blade member attached to the forward end of said slide member, the blade member including a pair of flexible resilient elongated parallelly-disposed arms, each arm including a blade portion for cutting a notch in the wire;

a first deflection cam surface formed on each arm;

a second deflection cam surface formed on the forward end of the sleeve carriage member;

the first and second deflection cam surfaces operatively contacting and camming against one another with relative longitudinal movement of the carriage sleeve and slide members;

the arms of the blade member reciprocatively deflecting toward and away from one another upon the cam surfaces camming against one another, the deflection of the arms inducing the blade portions into notching engagement with the wire when the wire is positioned between the blade portions and the arms are flexed inwardly toward each other; and actuating means mounted on said mounting structure and operative for contacting and inducing linear movement of the carriage sleeve member and the slide member, the actuating means first linearly advancing the carriage sleeve member and the slide member in unison to an extended position in which the separated blade portions straddle the wire, after having reached the extended position the actuating means next linearly moving the slide member relative to the carriage sleeve member to induce reciprocative movement of the arms and notching of the wire between the blade portions, and after completing the reciprocative notching movement the actuating means thereafter linearly retracting the carriage sleeve member and the slide member in unison to a retracted position.

18. A notcher device as defined in claim 17 wherein:

the actuating means further includes motive means mounted on said mounting structure and operatively connected separately to the carriage sleeve member and to the slide member to obtain independent linear movement of the carriage sleeve member and the slide member.

the motive means includes an eccentric member, eccentric surface means attached to the eccentric member, and a motor means for rotating the eccentric member; and the actuator means further comprises connector means operatively contacting the eccentric means of the eccentric member to obtain linear movement of the sleeve means and the slideable means upon rotation of the eccentric member.

19. A notcher as defined in claim 18 wherein the motive means further comprises:

an eccentric wheel;

motor means for rotating the wheel about a rotational axis;

a peripheral surface formed on the wheel and having a lobe located on the peripheral surface eccentrically with respect to the rotational axis of the wheel;

a groove formed in the wheel eccentrically with respect to the rotational axis of the wheel; and the notching device further comprising:

first connection means connected between the the carriage sleeve member and the eccentric groove and operative for transferring linear movement of the eccentric groove relative to the rotational axis of the wheel to the carriage sleeve member during rotation of the wheel; and second connection means connected to the slide member and contacting the eccentric peripheral surface and operative for transferring linear movement of the lobe relative to the rotational axis of the wheel to the slide member during rotation of the wheel.

20. A notcher as defined in claim 19 wherein the motor means further comprises a stepper motor.

21. A notcher as defined in claim 19 wherein the actuating means linearly advances the carriage sleeve member and the slide member to an extended position in which the blade portions straddle the wire, linearly moves the slide member to induce reciprocative movement of the arms, and linearly retracts the carriage sleeve member and slide member to a retracted position in which the blade portions do not straddle the wire, by a single complete rotation of the motor means.

22. A notcher as defined in claim 21 wherein the motor means:

rotates at a first predetermined rate to cause the actuating means to advance the carriage sleeve member and the slide member to an extended position in which the blade portions straddle the wire;

rotates at a second predetermined rate to cause the actuating means to move the slide member to induce reciprocative movement of the arms;

rotates at a third predetermined rate to cause the actuating means to retract the carriage sleeve member and slide member to a retracted position; and wherein:

the first predetermined rate is greater than the second predetermined rate; and the third predetermined rate is greater than the first predetermined rate.

23. A notcher as defined in claim 19 wherein the motor means rotates at a predetermined lower rate to cause the actuating means to move the slide member to induce reciprocative movement of the arms, than the motor means rotates to cause the actuating means to advance the carriage sleeve member and the slide member to an extended position in which the blade portions straddle the wire and to retract the carriage sleeve member and slide member to a retracted position in which the blade portions do not straddle the wire.

24. A notcher as defined in claim 19 wherein:

the first connection means includes a cam follower device connected at the rear end of the carriage sleeve member and extending into the eccentric groove;

the second connection means includes a contact member connected at the rear end on the slide member and contacting the peripheral surface; and further comprising:

biasing means operative between the carriage sleeve member and the slide member for biasing the slide member rearwardly with respect to the carriage sleeve member and maintaining the contact member in contact with the peripheral surface and the lobe during rotation of the wheel.

25. A notcher as defined in claim 24 further comprising:

an adjustable connection at the forward end of the slide member for connecting the blade member, the adjustable connection establishing the relative position of the deflecting cam surfaces of the carriage sleeve member and the blade member to control the amount of deflection of the blade portions upon relative movement of the carriage sleeve member and the slide member during notching engagement of the blade portions with the wire.

26. A notcher as defined in claim 25 wherein:
the slide member is coaxially positioned within the carriage sleeve member.

27. A method of forming a notch in a wire with a pair of spaced apart cutting blades to facilitate a subsequent separation of the wire by applying linear tensile separation force to a remaining portion of the wire at the notched location, comprising the steps of:
moving the cutting blades for reciprocative movement toward and away from each other,
moving the blades into and out of straddling relationship with the wire,
moving the blades into straddling relationship with the wire,
subsequently moving the blades into notching engagement with the wire to leave a remaining portion of the wire at the notched location,
removing the blades from notching engagement with the wire after creation of the remaining portion, and
removing the blades from straddling engagement with the wire.

28. A method as defined in claim 27 wherein:
the step of moving the blades into and out of straddling relationship with the wire is performed by rotating a motor;
the step of moving the cutting blades for reciprocative movement toward and away from each other achieves the notching engagement with the wire and is also performed by rotating the motor; and further comprising:
rotating the motor at a predetermined lower rate to move the blades for reciprocative movement than the motor is rotated to move the blades into and out of straddling relationship with the wire.

29. A method as defined in claim 28 further comprising:
rotating the motor at a first predetermined rate to move the blades into the straddling relationship with the wire;
rotating the motor at a second predetermined rate to move the cutting blades reciprocatively into and out of notching engagement with the wire;
rotating the motor at a third predetermined rate to move the blades out of straddling relationship with the wire; and wherein:
the first predetermined rate is greater than the second predetermined rate; and
the third predetermined rate is greater than the third predetermined rate.

* * * * *

UNITED STATES PATENT AND TRADEMARK OFFICE
CERTIFICATE OF CORRECTION

PATENT NO.    : 5,067,382

DATED         : Nov. 26, 1991

INVENTOR(S)   : Eckehart Zimmerman, Thomas A. Thorson and Mark E. Hanson

It is certified that error appears in the above-identified patent and that said Letters Patent is hereby corrected as shown below:

The title page should be deleted to appear as per attached title page.

Signed and Sealed this

Eleventh Day of August, 1992

*Attest:*

DOUGLAS B. COMER

*Attesting Officer*     *Acting Commissioner of Patents and Trademarks*

United States Patent [19]
Zimmerman et al.

[11] Patent Number: 5,067,382
[45] Date of Patent: Nov. 26, 1991

[54] METHOD AND APPARATUS FOR NOTCHING A LEAD WIRE ATTACHED TO AN IC CHIP TO FACILITATE SEVERING THE WIRE

[75] Inventors: Eckehart Zimmerman; Thomas A. Thorson, both of Colorado Springs, Colo.; Mark E. Hanson, Cascade, Colorado

[73] Assignee: Cray Computer Corporation, Colorado Springs, Colo.

[21] Appl. No.: 608,258

[22] Filed: Nov. 2, 1990

[51] Int. Cl.$^5$ .............................................. B26D 3/14
[52] U.S. Cl. ........................................ 83/879; 83/693; 83/880; 83/588; 30/245; 29/566.3
[58] Field of Search ............... 83/879, 880, 588, 692, 83/693; 228/4.5; 225/96, 96.5; 29/566.3, 840; 140/105; 72/325; 30/245, 187, 188, 189

[56] References Cited
U.S. PATENT DOCUMENTS 4,425,947  1/1984  Maxner et al. .................. 140/105

Primary Examiner—Mark Rosenbaum
Assistant Examiner—Allan M. Schrock
Attorney, Agent, or Firm—John R. Ley

[57] ABSTRACT

A method and apparatus for notching a wire so that it can be severed at the notched location by applying an axial force thereto. The apparatus includes a linearly reciprocal mechanism adapted to move forwardly, placing a pair of cutting blades in straddling relationship with the wire and includes an actuating mechanism for laterally reciprocating the cutting blades to form notches in opposite sides of the wire before retracting the cutting blades from the straddling relationship with the wire. The method of the invention includes the steps of moving a pair of cutting blades into straddling relationship with a wire, reciprocally moving the cutting blades into and out of cutting engagement with the wire and subsequently retracting the cutting blades from the straddling relationship with the wire.

29 Claims, 5 Drawing Sheets